United States Patent
Cobanoglu et al.

(10) Patent No.: US 11,561,002 B2
(45) Date of Patent: Jan. 24, 2023

(54) FABRIC AND ARTICLE WITH LED EMBEDDED THEREIN AND THE RELATED PRODUCTION PROCESS

(71) Applicant: Sanko Tekstil Isletmeleri San. Ve Tic. A.S., Inegol-Bursa (TR)

(72) Inventors: Ozgur Cobanoglu, Inegol-Bursa (TR); Fehim Caglar, Inegol-Bursa (TR); Serkan Mert, Inegol-Bursa (TR); Deniz Iyidogan, Inegol-Bursa (TR); Adnan Kocamer, Inegol-Bursa (AR); Hakan Dincer, Inegol-Bursa (AR); Ertug Erkus, Inegol-Bursa (TR)

(73) Assignee: SANKO TEKSTIL ISLETMELERI SAN. VE TIC. A.S., Inegol-Bursa (TR)

( * ) Notice: Subject to any disclaimer, the term of this patent is extended or adjusted under 35 U.S.C. 154(b) by 0 days.

(21) Appl. No.: 16/519,284

(22) Filed: Jul. 23, 2019

(65) Prior Publication Data
US 2020/0056777 A1 Feb. 20, 2020

(30) Foreign Application Priority Data
Jul. 24, 2018 (EP) .................................... 18185233

(51) Int. Cl.
*F21V 33/00* (2006.01)
*A41D 27/08* (2006.01)
(Continued)

(52) U.S. Cl.
CPC ........ *F21V 33/0008* (2013.01); *A41D 27/085* (2013.01); *F21V 23/003* (2013.01);
(Continued)

(58) Field of Classification Search
CPC ............ F21V 33/0008; F21W 2121/06; A41D 27/085
See application file for complete search history.

(56) References Cited

U.S. PATENT DOCUMENTS

| 4,823,240 A | 4/1989 | Shenker |
| 10,132,490 B1 * | 11/2018 | Olivero .................. H05B 47/19 |

(Continued)

FOREIGN PATENT DOCUMENTS

| CA | 2416101 | 12/2003 |
| CN | 201365557 | 12/2009 |

(Continued)

OTHER PUBLICATIONS

International Search report dated Aug. 19, 2019 for corresponding International application No. PCT/EP2019/069895.
(Continued)

*Primary Examiner* — Julie A Bannan

(57) ABSTRACT

It is disclosed a fabric (10) comprising a main layer (1), at least one LED (2) and a supporting element (3), wherein said at least one LED (2) is arranged on a coupling surface (3a) of said supporting element (3), and wherein said coupling surface (3a) is coupled to the inner surface (1a) of said main layer (1), said supporting element (3) comprising a plurality of electrical connections (4) to electrically connect said at least one LED (2) to a logic control unit (6) configured to control said at least one LED (2) in function of a sensing signal coming from a sensing device (7), said main layer (1) being provided with at least one opening (5) arranged in correspondence of said at least one LED (2) for allowing the light emitted by said at least one LED (2) to pass therethrough. It is further disclosed an article comprising the above mentioned fabric (10) and a process for producing the fabric (10).

15 Claims, 6 Drawing Sheets

(51) Int. Cl.
*F21V 23/00* (2015.01)
*F21V 23/04* (2006.01)
*H01L 33/62* (2010.01)
*F21Y 103/10* (2016.01)
*F21Y 115/10* (2016.01)
*F21W 121/06* (2006.01)

(52) U.S. Cl.
CPC .......... *F21V 23/0485* (2013.01); *H01L 33/62* (2013.01); *F21W 2121/06* (2013.01); *F21Y 2103/10* (2016.08); *F21Y 2115/10* (2016.08); *H01L 2933/0066* (2013.01)

(56) References Cited

U.S. PATENT DOCUMENTS

| | | | | |
|---|---|---|---|---|
| 2006/0082987 A1* | 4/2006 | Dorsey | ................ | F21V 33/006 362/103 |
| 2009/0286039 A1* | 11/2009 | Weedlun | ................ | B44F 7/00 428/114 |
| 2010/0102730 A1* | 4/2010 | Simon | ................ | F21V 23/0457 315/152 |
| 2012/0155065 A1* | 6/2012 | Ubaghs | ................ | G09F 13/22 362/103 |
| 2013/0215604 A1 | 8/2013 | Chu et al. | | |
| 2014/0340877 A1* | 11/2014 | Nelson | ................ | F21V 23/005 362/103 |
| 2016/0015102 A1* | 1/2016 | Fonte | ................ | F21V 33/0008 362/108 |
| 2016/0345655 A1* | 12/2016 | Beers | ................ | A41D 27/205 |
| 2017/0098353 A1* | 4/2017 | Ekambaram | ................ | G08B 13/14 |
| 2018/0373293 A1* | 12/2018 | Staton | ................ | G06F 1/1652 |

FOREIGN PATENT DOCUMENTS

| | | |
|---|---|---|
| CN | 202786895 | 3/2013 |
| EP | 3 272 281 | 1/2018 |

OTHER PUBLICATIONS

European Search report dated Jan. 17, 2019 for EP priority application No. 18185233.6.

Office Action issued by the CN Patent Office dated May 26, 2022 for corresponding CN application No. 201910669935.1.

\* cited by examiner

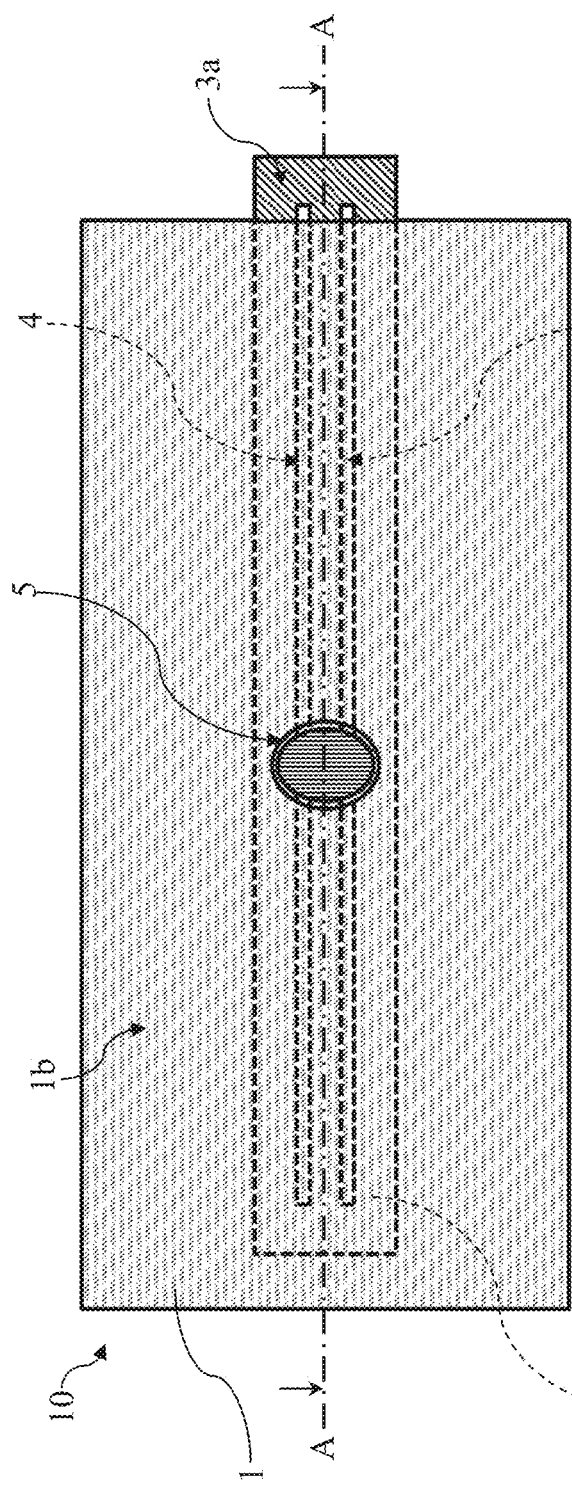
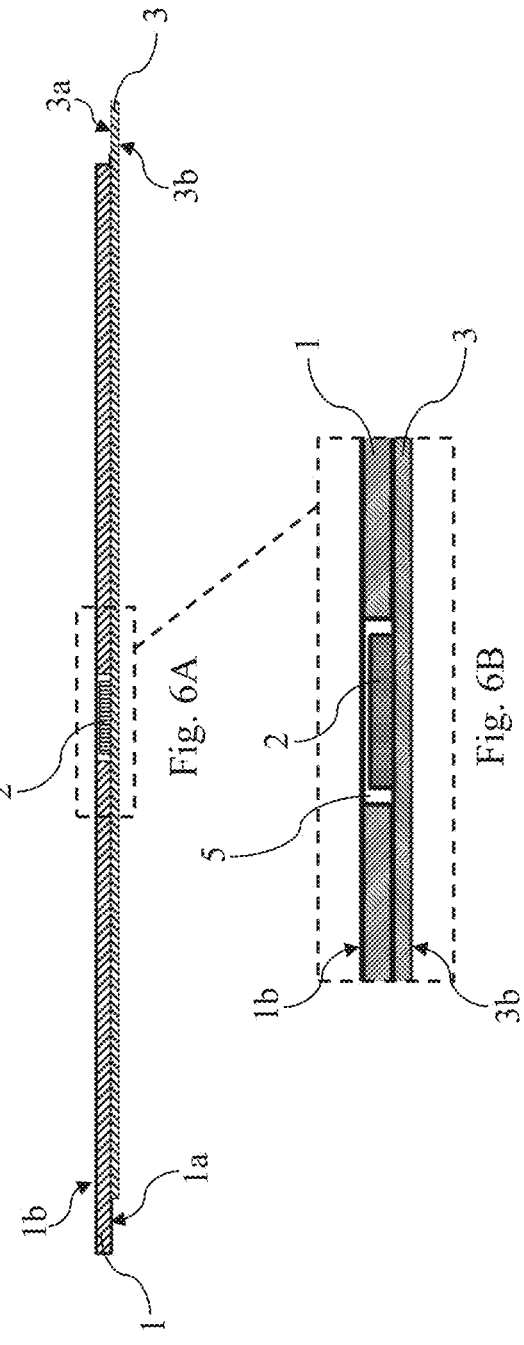
Fig. 5
Fig. 6A
Fig. 6B

FABRIC AND ARTICLE WITH LED EMBEDDED THEREIN AND THE RELATED PRODUCTION PROCESS

This non-provisional application claims priority to and the benefit of European Application No. EP18185233 filed on 24 Jul. 2018, the content of which is incorporated herein by reference in its entirety.

TECHNICAL FIELD

The present invention relates to the field of E-textiles (also known as smart garments, smart clothing, smart textiles, or smart fabrics). In particular, the present invention relates to a fabric having one or more LEDs (Light Emitting Diode) embedded therein and to a process for producing such a fabric.

BACKGROUND

E-textiles and in particular smart garments are generally provided with electronic components (e.g. sensors, actuators, microcontrollers, etc.) for providing articles of clothing (e.g. T-shirts, shoes, gloves, pants, etc.) used for different purposes.

Garments having LEDs, such as shoes for kids having LEDs activated in response to the wearer's steps, T-shirts or jackets having LEDs coupled to the fabric, are known. These garments are used for example to obtain a flashy appearance or to signal the presence of the wearer (e.g. during jogging or during riding on a bike or a motorcycle on a dark road).

However, often the presence of LEDs may jeopardize the stylish appearance of a garment, especially when LEDs are turn off.

SUMMARY OF THE INVENTION

An object of the present invention is to overcome the drawbacks of the prior art cited above and to provide a fabric with one or more LEDs embedded therein able to be employed in articles without jeopardize its aesthetic appearance.

A further object of the present invention is to provide a process for producing in a simple and reliable manner a fabric having one or more LEDs embedded therein and able to be employed in articles having stylish appearance.

These and other objects are achieved by the present invention by a fabric, an article, and a process according to the independent claims. Preferred aspects of the invention are recited in dependent claims.

In particular, according to the present invention, the fabric comprises a main layer, and at least one LED.

The main layer has a substantially planar shape comprised between two surfaces. In particular, the main layer has a substantially two-dimensional extension, i.e. having one of three dimensions (the thickness defined by the distance between the two surfaces) substantially negligible with respect to the other two dimensions. The main layer is provided with an inner surface and an outer surface. The main layer may comprise for example a woven fabric layer, a knitted fabric layer or a nonwoven fabric layer.

The fabric according to the present invention comprises a plurality of electrical connections to electrically connect one or more LEDs to a logic control unit configured to control the LED(s) in function of a sensing signal coming from a sensing device.

According to an aspect of the present invention, the main layer is provided with at least one opening or at least one covering portion arranged in correspondence of the LED(s). Thanks to this aspect, The LED(s), when turned OFF, is concealed from the sight of the user, still the light emitted by the LED(s) can pass through the opening or through the covering portion (i.e. the light emitted by LED(s) is visible from outside). In particular, the skilled person knows how to choose the dimension and/or the position of the opening in order to adjusting the amount of light passing through the opening. Analogously, the skilled person knows how to choose the material and/or how to configure the covering portion to adjust the amount of light passing through the covering portion (e.g. by choosing the thickness, or the translucency of the covering portion).

The covering portion is preferably a layer made of a material that allows the light emitted by LED(s) to pass therethrough. For example, the covering portion may be a layer made of plastic or a fabric layer (e.g. a woven fabric).

Preferably, the fabric comprises a main layer, at least one LED and a supporting element.

The supporting element has a substantially planar shape comprised between two surfaces. In particular, the supporting element has a substantially two-dimensional extension, i.e. having one of three dimensions (the thickness defined by the distance between the two surfaces) substantially negligible with respect to the other two dimensions.

The supporting element is provided with a coupling surface and an inner surface. One or more LEDs are preferably arranged on the coupling surface of the supporting element. The supporting element comprises a plurality of electrical connections to electrically connect the LED(s) to a logic control unit configured to control the LED(s) in function of a sensing signal coming from a sensing device.

According to an aspect of the present invention, the coupling surface of the supporting element is coupled to the inner surface of the main layer. The main layer is preferably provided with at least one opening arranged in correspondence of the LED(s) for allowing the light emitted by the LED(s) to pass therethrough.

Some embodiments may provide that the main layer is provided with at least one covering portion arranged in correspondence of the LED(s) for allowing the light emitted by LED(s) to pass therethrough. Preferably, the covering portion is not opaque, more preferably the covering portion is translucent. For example, the covering portion may be a fabric layer having a thickness reduced (preferably a thickness less than the thickness of the main layer). For example, the covering portion may comprise a white fabric layer, such as a gauze.

According to an aspect of the present invention, the covering portion is arranged to form a substantially tubular housing for containing the electrical connections and the LED(s). The covering portion is preferably fastened to the main layer for example by stitching, by sewing, or by other equivalent fastening means known in the art. Thanks to this aspect, LEDs may be embedded in a fabric in a simple and reliable manner.

Preferably, the fabric comprises a plurality of LEDs and a plurality of openings, wherein for each LED an opening is arranged in correspondence therewith.

According to an aspect of the present invention, the sensing device is preferably coupled to a sensing portion of the main layer. Preferably, the sensing device comprises a touch sensor, more preferably a capacitive touch sensor.

Some embodiments may provide that the sensing signal is indicative of a touch event on a sensing portion of the main layer.

According to an aspect of the present invention, the supporting element is shaped as a ribbon. Preferably, the supporting element is made of plastic and/or textile. Advantageously, the supporting element is elastically stretchable by at least 10%.

According to an aspect of the present invention, the size of the opening(s) is substantially the same of the size of the LED(s). In other words, the areas in a top view of the opening and of the LED are substantially the same, i.e. when the LED is coupled to the supporting element and the opening is provided to the main layer, the orthogonal projections of the LED and of the opening on a plane parallel to both the supporting element and to the main layer have substantially the same area. Preferably, the LED protrudes from the coupling surface of the supporting element and passes at least partially through the opening.

According to an aspect of the present invention, the opening(s) of the main layer is(are) made by laser cutting.

According to an aspect of the present invention, the supporting element is coupled to the main layer by lamination.

A further object of the present invention is an article comprising the fabric of the present invention. Preferably, the article is a garment.

According to an aspect of the present invention the article is provided with a pocket comprising the fabric according to the present invention, said sensing unit being arranged within the pocket.

A further object of the present invention is a process for producing a fabric according to the present invention, wherein the process comprises the following steps:
 (a) providing a plurality of electrical connections;
 (b) electrically connecting one or more LEDs to the electrical connections;
 (c) providing at least one opening or at least one covering portion to a main layer;
 (d) coupling the LED(s) to the main layer.

According to an aspect of the present invention, the step (d) is carried out so that the opening or the covering portion provided to the main layer in the step (c) is arranged in correspondence of the LED for allowing the light emitted by the LED to pass therethrough.

Preferably, the step (a) is carried out by providing a supporting element having the plurality of electrical connections, wherein the step (b) is carried out by arranging one or more LED(s) on a coupling surface of the supporting element and electrically connecting the LED(s) to the electrical connections of the supporting element, and wherein the step (d) is carried out by coupling the supporting element to the main layer so that the coupling surface of the supporting element is coupled to the inner surface of the main layer.

Preferably, the supporting element is elastically stretchable by at least 10%, and wherein the process comprises the further step of stretching the supporting element during the step (d).

According to an aspect of the present invention, the step (d) is carried out by lamination.

Preferably, the step (c) of providing at least on opening to the main layer is carried out by laser cutting.

Preferably, the step (c) of providing at least one covering portion to the main layer is carried out by fastening the covering portion to the main layer, wherein the covering portion is arranged to form a substantially tubular housing for containing the electrical connections and the LED(s).

A further object of the present invention is the use of an article comprising the fabric according to the present invention as a fidget device, or in general as a device with which the user can play with it.

Fidget devices (called also "fidget toys") aim to alleviate the effects of fidgeting (the act of moving about restlessly in a way that is not essential to ongoing tasks or events). Thanks to the present invention, the use of an article according to the present invention (for example a garment) may help for example students with autism or attention deficit hyperactivity disorder (ADHD) focus better, or in general may provide a device with which the user can play with it.

BRIEF DESCRIPTION OF THE DRAWINGS

The invention will now be described in greater detail, by way of example, with reference to the accompanying non limiting drawings. It is emphasized that, according to common practice, the various features of the drawing are not necessarily to scale. On the contrary, the dimensions of the various features are arbitrarily expanded or reduced for clarity. Like numerals denote like features throughout the specification and the drawings in which:

FIGS. 2-5 are top views that schematically show the main steps of a process for producing the fabric of FIG. 1 according to an embodiment of the present invention;

FIG. 6A schematically shows a longitudinal section view according the cutting plane A-A of the fabric shown in FIG. 5;

FIG. 6B is an enlarged view of the longitudinal section view shown in FIG. 6A;

DETAILED DESCRIPTION

Figure 1:
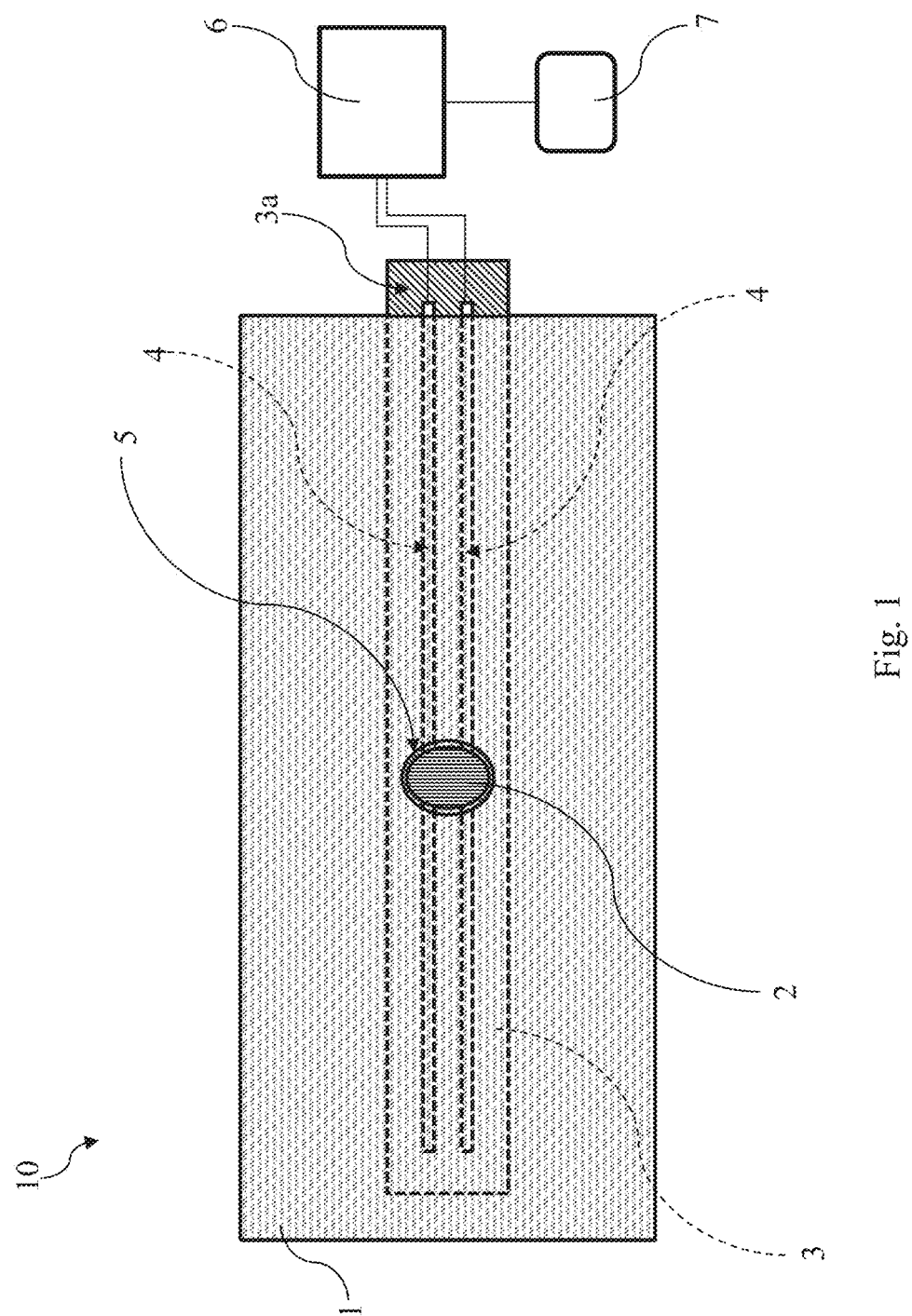
FIG. 1 schematically shows a perspective top view of a fabric according to an embodiment of the present invention.

FIG. 1 schematically shows a top view of a fabric 10 according to a possible embodiment of the present invention. In particular, the fabric 10 comprises a main layer 1 having a substantially planar shape comprised between two surface (an inner surface 1a and an outer surface 1b). The main layer 1 may comprise for example a woven fabric layer, a knitted fabric layer or a nonwoven fabric layer.

The fabric 10 further comprises at least one LED 2 and a supporting element 3. The supporting element 3 is provided with a coupling surface 3a and an inner surface 3b. LED 2 is arranged on the coupling surface 3a of the supporting element 3. In particular, the supporting element 3 comprises a plurality of electrical connections 4 to which the LED 2 is electrically connected.

The coupling surface 3a of the supporting element 3 is coupled to the inner surface 1a of the main layer 1. The main layer 1 is provided with at least one opening 5 arranged in correspondence of the LED 2 for allowing the light emitted by the LED 2 to pass therethrough.

The top view of FIG. 1 schematically shows the supporting element 3 with a portion (depicted in dotted line) arranged below the main layer 1 and an exposed portion connected to a block scheme. The electrical connections 4 electrically connect the LED 2 to a logic control unit 6 configured to control the LED 2 in function of a sensing signal coming from a sensing device 7.

The sensing device 7 may comprise one or more types of sensors. In particular, the sensing device 7 may comprise at least one accelerometer and/or at least one magnetometer and/or at least one gyrometer and/or at least one touch sensor. As better discussed below, the control unit 6 reads out from the sensing device 7 a sensing signal indicative of a particular event detected by means of one or more of the above mentioned sensors, and in response to the sensing signal controls the LED 2 according to a predetermined logic function.

FIGS. 2-5 show the main steps of a possible embodiment of the process for producing a fabric 10 according to the present invention. In particular, the process comprises the following steps:
(a) providing a plurality of electrical connections 4;
(b) electrically connecting at least one LED 2 to the electrical connections 4;
(c) providing at least one opening 5 (shown in FIG. 4) or at least one covering portion 12 (visible in FIGS. 9A and 9B) to the main layer 1;
(d) coupling one or more LEDs 2 to the main layer 1;

The particular embodiment of the process shown in FIGS. 2-5 preferably provides that the step (a) is carried out by providing a supporting element 3 having the plurality of electrical connections 4, wherein the step (b) is carried out by arranging one or more LEDs 2 on a coupling surface 3a of the supporting element 3 and electrically connecting the LED(s) 2 to the electrical connections 4 of the supporting element 3, and wherein said step (d) is carried out by coupling the supporting element 3 to the main layer 1 so that said coupling surface 3a of the supporting element 3 is coupled to the inner surface 1a of the main layer.

Figure 2:
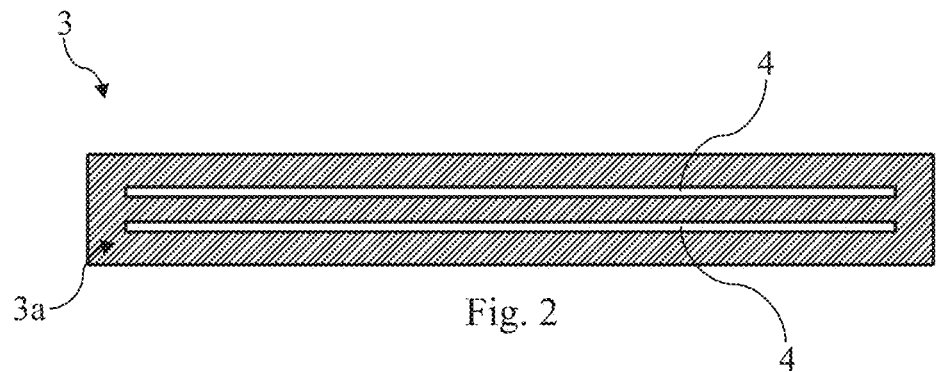
Figure 3:
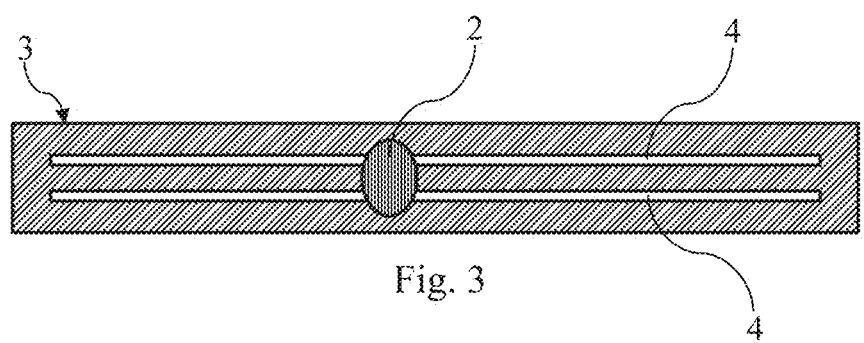
Figure 4:
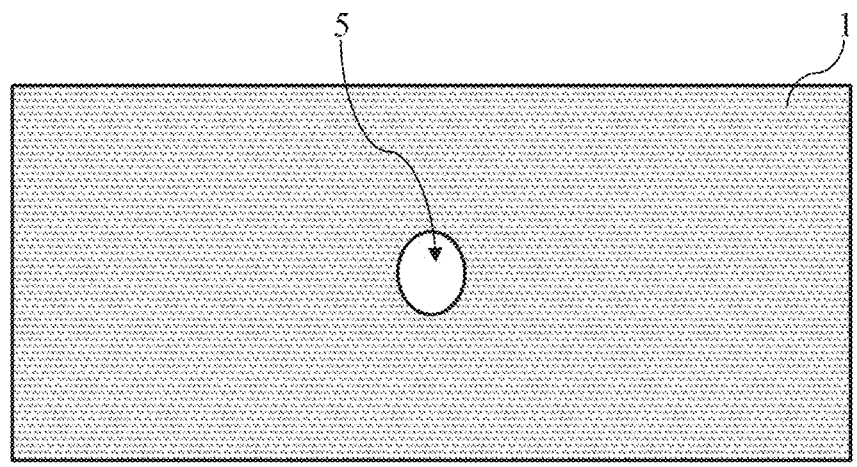

In other words, the embodiment of the process shown in FIGS. 2-5 comprises the following steps:
(a) providing a supporting element 3 having a plurality of electrical connections 4 (FIG. 2);
(b) arranging at least one LED 2 on the coupling surface 3a of the supporting element 3 and electrically connecting the LED 2 to the electrical connections 4 (FIG. 3);
(c) providing at least one opening 5 to the main layer 1 (FIG. 4);
(d) coupling the supporting element 3 to the main layer 1 so that the coupling surface 3a of the supporting element 3 is coupled to the inner surface 1a of the main layer 1 (FIG. 5).

The supporting element 3 is preferably formed of plastic and/or textile. The supporting element 3 has a substantially planar shape comprised between the coupling surface 3a and the inner surface 3b (clearly indicated in FIG. 6A).

With respect to FIG. 2, the supporting element 3 is preferably shaped as a ribbon. Some embodiments may provide that the supporting element 3 is made of plastic material. For example, the supporting element 3 may be a plastic ribbon, preferably formed of Kapton® and the electrical connection 4 may be electrically conductive tracks arranged parallel to each other along the ribbon. Kapton® is a polyimide film developed by DuPont in the late 1960s that remains stable across a wide range of temperatures and is commonly used in flexible printed circuits, among other things.

In FIG. 2, the supporting element 3 is shown with only two electrical connections 4 configured to provide the power supply coming from a battery or a suitable power source (not shown) to the LED 2.

In other embodiments, the supporting element 3 comprises multiple electrical connections 4 and forming a communication bus, for example for controlling selectively a plurality of LED 2 coupled to the same supporting element 3.

Preferably, the supporting element 3 is flexible, i.e. able to be bent or in general deformed easily without breaking in response to an applied force. As a result, when the supporting element 3 is coupled to the main layer 1, also the fabric 10 may be bent for example to follow a curved surface or in general a not flat surface.

Some embodiments may provide that the supporting element 3 is made of textile. For example, the supporting element 3 may be formed by weaving or knitting textile yarns with electrically conductive yarns that form the electrical connections 4.

Preferably, the supporting element 3 is elastically stretchable by at least 10%. In other words, by applying a determined force at the ends of the supporting element 3, it can be stretched (i.e. deformed by increasing its length) by at least 10%. When the force is removed, the supporting element 3 returns elastically to the original size. For example, with respect to FIG. 2, the supporting element 3 may be formed of textile material comprising preferably elastic stretchable yarns weaved or knitted with electrically conductive yarns that form the electrical connections 4. Some embodiments may provide that each electrical connection 4 of the supporting element 3 comprise an elastic stretchable yarn (e.g. forming an elastic stretchable core) coupled (e.g. by twisting) with an electrically conductive yarn (e.g. made of copper).

Other embodiments (not shown) may provide that the electrical connections 4 of the supporting element 3 are arranged along a crooked path (i.e. a continuously nonlinear path), such as a wavy (undulating) or a zigzag path. The electrical connections 4 tend to follow a more crooked path in a relaxed position, i.e. in absence of a stretching force, than when a stretching force is applied. In other words, when a stretching force is applied to the ribbon, the electrical connections 4 follow a path which is more linear in shape, i.e. the electrical connections 4 straighten out.

Other embodiments may provide that the supporting element 3 comprises a ribbon of both plastic and textile. For example, the supporting element 3 may comprise at least one portion of plastic material (e.g. Kapton) forming a circuit board to which LED 2 may be coupled, and a ribbon made of textile comprising electrical connections 4 electrically connected to the LED 2. Preferably, the electrical connections 4 of the ribbon may be coaxial cables. More preferably, the ribbon may be elastically stretchable by at least 10%, and the coaxial cables are arranged along a crooked path. Elastic stretchability of the supporting element 3 may be evaluated with the following standards:

ASTM D4964—Tension and Elongation of Elastic Fabrics (CRE Tensile Tester);
ASTM D6614—Stretch Properties of Textile Fabrics—CRE Method;

ASTM D5278/D5278M-09(2017)—Standard Test Method for Elongation of Narrow Elastic Fabrics (Static-Load Testing).

Preferably, the standard used for evaluating elastic stretchability of the supporting element 3 is ASTM D5278/D5278M-09(2017).

With respect to FIG. 3, LED 2 may be electrically connected to the electrical connections 4 of the supporting element 3 for example by soldering or by means of a conductive paste.

With respect to FIG. 4, opening 5 is provided to the main layer 1 to form a passage through the inner and the outer surfaces 1a, 1b. The opening 5 is made by removing the material of the main layer 1 in a determined portion of the main layer 1. The size of the opening 5 is preferably substantially the same of the size of the LED 2. The opening 5 is made preferably by a laser cutting process, to obtain a determined shape (preferably substantially the same of the shape of the LED) with high precision.

With respect to FIG. 5, during the step (d) the supporting element 3 is coupled to the main layer 1 by arranging the opening 5 in correspondence of the LED 2 for allowing the light emitted by the LED 2 to pass through the opening 5.

Preferably, in case of a supporting element 3 elastically stretchable by at least 10%, some embodiment of the process may comprise the further step of stretching the supporting element 3 during the step (d). As a result, the same supporting element 3 with a plurality of LEDs 2 coupled to its coupling surface 3a the can be coupled to different main layer 1 with openings 5 arranged at different distances to each other. In other words, the step of stretching the supporting element 3 is carried out such that LEDs 2 find their openings 5 on the main layer 1.

With respect to FIGS. 6A and 6B, the supporting element 3 is coupled to the main layer 1 so that the coupling surface 3a of the supporting element 3 is coupled to the inner surface 1a of the main layer 1.

Preferably, the supporting element 3 is coupled to the main layer 1 by lamination. For example, lamination may be carried out by using an adhesive material (laminant) so that a bond between the inner surface 1a of the main layer 1 and the coupling surface 3a of the supporting element 3 is formed.

For example, the main layer 1 and the supporting element 3 may be coupled by applying between the inner surface 1a of the main layer 1 and the coupling surface 3a of the supporting element 3 a lamination material (a film or sheet) having a double-side adhesive. As a result, the supporting element 3 may be easily coupled to the main layer 1 allowing a precise positioning of LED 2 with respect to the opening 5 of the main layer 1.

Some embodiments may provide that a further lamination may be carried out on the inner surface 3b of the supporting element 3. For example, a further lamination material (not shown) having a single-side adhesive may be applied for covering the inner surface 3b of the supporting element 3 and the surrounding part of the inner surface 1a of the main layer 1. As a result, the inner surface 3b of the supporting element 3 is protected and the coupling between the main layer 1 and the supporting element 3 may be more reliable.

As shown in the enlarged view of FIG. 6B, LED 2 protrudes from the coupling surface 3a of the supporting element 3 and passes at least partially through the opening 5. Some embodiment may provide that the LED 2 passes through the opening 5 and slightly protrudes from the outer surface 1b of the main layer 1. Preferably, the thickness of the main layer 1 and the type of LED are chosen so that LED 2 are substantially flush with the outer surface 1b of the main layer 1. Suitable LEDs may be SMD LEDs, i.e. LEDs in Surface Mount Technology (SMT), preferably with the following package: 805, 603, or 405.

Figure 7:
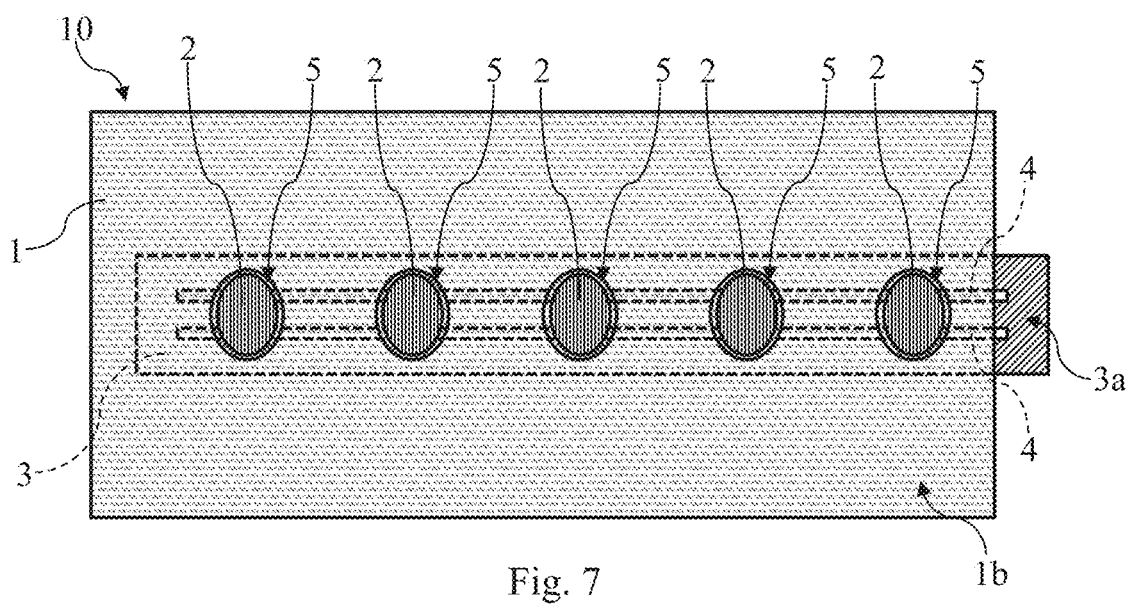
FIG. 7 schematically shows a perspective top view of a fabric according to a further embodiment of the present invention.

FIG. 7 shows a particular embodiment of the fabric 10 wherein a plurality of LEDs 2 are coupled to the coupling surface 3a of the supporting element 3 and electrically connected to the electrical connections 4. The main layer 1 is provided with a plurality of openings 5, so that for each LED 2 an opening 5 is arranged in correspondence therewith.

For example LEDs 2 may be electrically connected in parallel to the electrical connections 4, to be controlled all together by a logic control unit 6 on the basis of the sensing signal coming from a sensing unit 7.

Preferably, some embodiment may provide that all LEDs 2 are turned on for example when an acceleration detected by the sensing unit 7 in a determined direction exceeds a certain threshold value, or when a touch event is detected by the sensing unit 7. Further logic functions may be carried out by the logic control unit 6. For example, the control unit 6 may control the voltage supply value provided to the LEDs 2 in function of the sensing signal. In particular, some embodiments may provide that the voltage supply value provided to the LEDs is determined by the logic control unit in function of the sensing signal, so that the light intensity emitted by LEDs 2 is a function of the sensing signal. In other words the voltage supply value provided to the LEDs 2 is preferably comprised between an OFF value (wherein LEDs 2 are turned off and no light is emitted) and an ON value (wherein the LED 2 is turned on and it emits light with an intensity proportional to the ON value) determined by the control logic unit 6.

Figure 8:
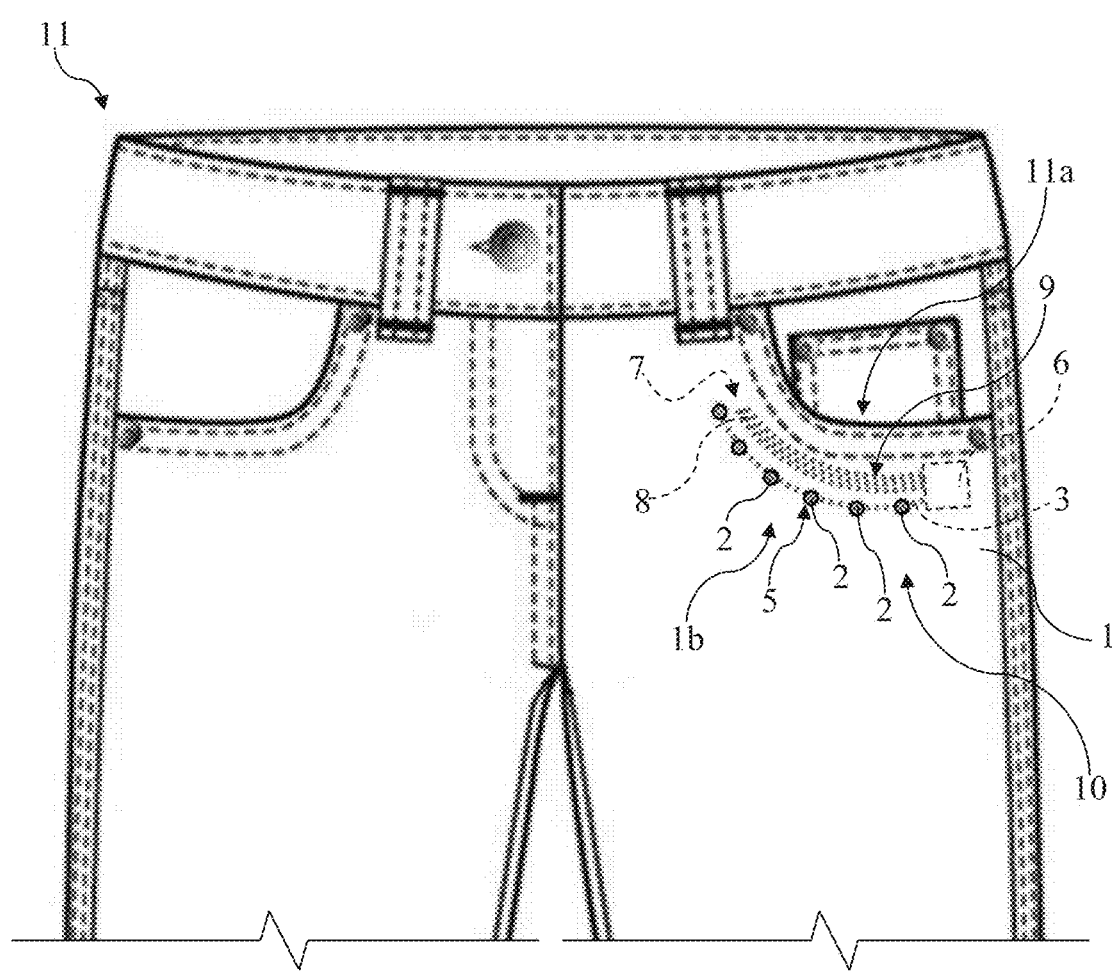
FIG. 8 schematically shows a perspective view of an article according to an embodiment of the present invention.

With respect to FIG. 8, the fabric 10 may be used in an article 11, preferably a garment. The garment shown in FIG. 8 is a pair of pants comprising a pocket 11a.

In this embodiment, the pocket 11a of the garment 11 comprises a fabric 10 according to the present invention. In particular, the main layer 1 of the fabric 10 is a woven fabric layer (e.g. denim) having an outer surface 1b arranged externally the pocket 11a. The pocket 11a comprises an inner lining coupled (e.g. sewn) to the fabric 10.

Analogously, to the fabric 10 shown in FIG. 7, the pocket 11a of FIG. 8 comprises a fabric 10 having a plurality of LEDs 2 arranged on a supporting element 3 (symbolically depicted in dotted line) coupled to the inner surface 1a of the main layer 1. Each LED 2 passes through a respective opening 5, having substantially the same size and shape of the LED 2, so that only the LEDs 2 may be visible from the exterior of the garment 11.

A sensing unit 7, preferably provided with a touch sensor 8 (for example a capacitive touch sensor) is arranged within the pocket 11a of the garment 11.

The sensing unit 7 is preferably coupled to a sensing portion 9 of the main layer 1. Further embodiments may provide however that the article 11 comprises a sensing unit 7 coupled to other parts of the article. For example, some embodiments may provide that the sensing unit 7 may comprise a touch sensor 8 coupled to an inner wall of the pocket lining still remaining within the scope of protection of the present invention.

The article 11 shown in FIG. 8 further comprises a logic control unit 6 (symbolically indicated as a dotted square). Logic control unit 6 may be coupled to the supporting element 3 of the fabric 10 or may be arranged in another part of the article 11. For example, the logic control unit 6 may be electrically connected to the electrical connection 4 of the supporting element 3 by wires, conductive traces or electrically conductive yarns arranged within a seam of the article (e.g. a seam of a garment).

Logic control unit 6 may be for example configured to turn on all the LEDs 2 in response of a touch event detected by the touch sensor 8. In this embodiment when the user touch the touch sensor 8 placed within the pocket 11a, the LEDs 2 of the fabric 10 are turned on by the logic control unit 6.

Some embodiments may provide other types of articles 11 other than garments (e.g. bags, fidget devices, etc.) comprising the pocket 11a with the fabric 10 of the present invention still remaining within the scope of protection of the present invention.

Some embodiments may provide that the article 11 comprises a housing, for example the article 11 may be a bag (not shown), and that the fabric 10 according to the present invention is coupled on the inner wall of housing, so that LEDs can light the interior of the housing in response to a sensing signal, coming from a sensing device (e.g. a touch sensor) coupled to the article, when the user insert a hand within the housing or touch a determined portion of the article.

Figure 9A:
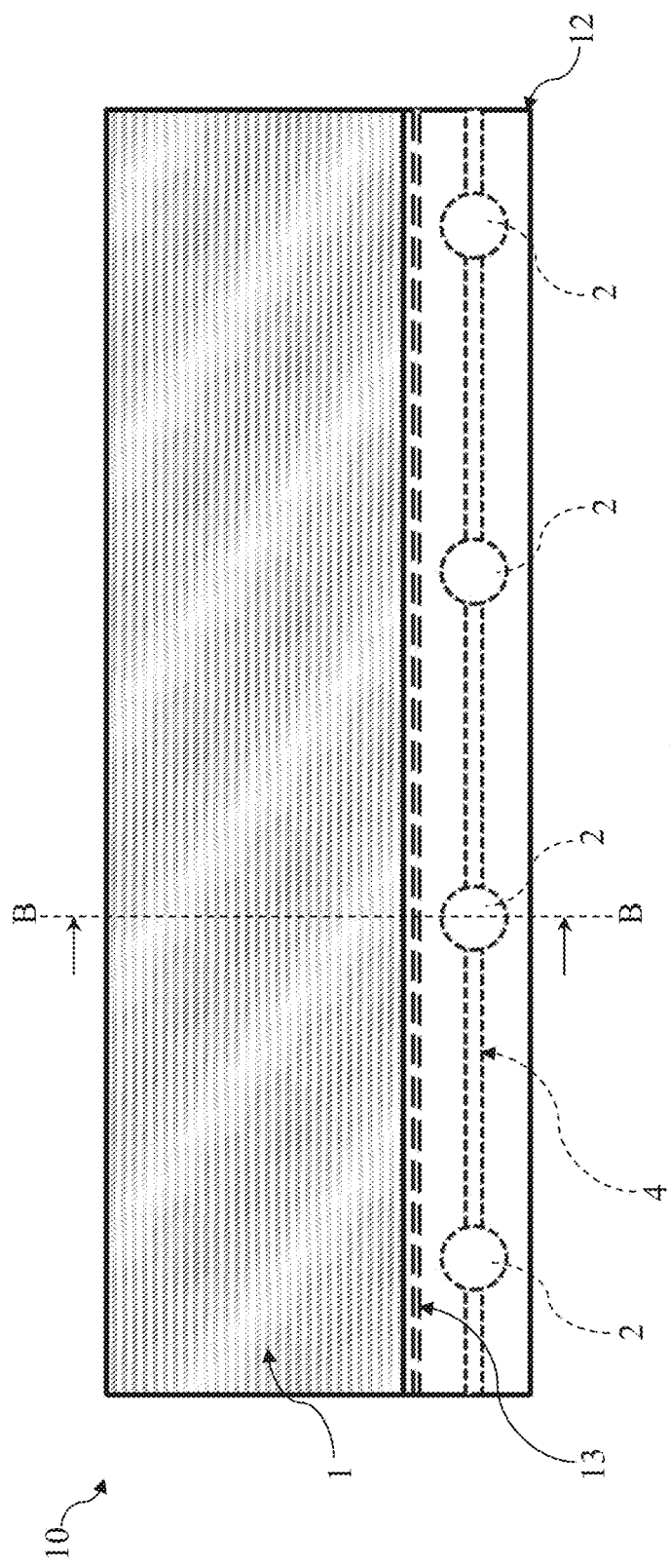
FIG. 9A schematically shows a perspective top view of a fabric according to an embodiment of the present invention.
Figure 9B:
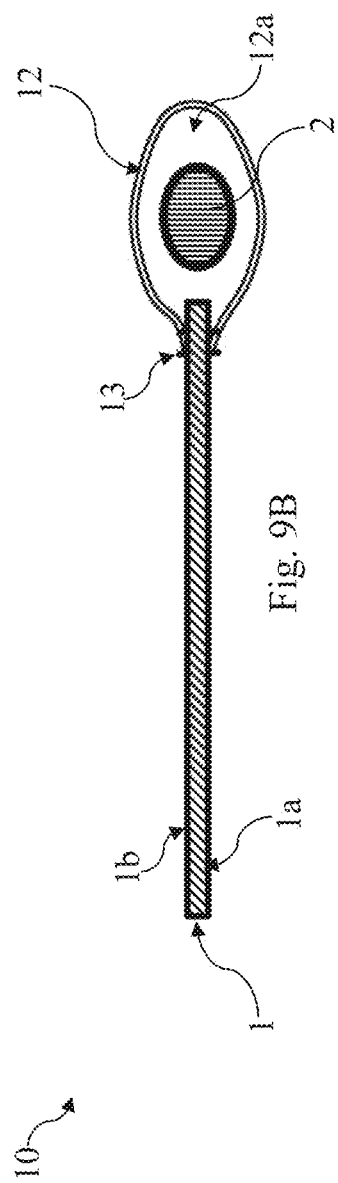
FIG. 9B schematically shows a transversal section view according the cutting plane B-B of the fabric shown in FIG. 9A.

FIGS. 9A and 9B show a further embodiment of the fabric 10 according to the present invention. In particular, FIG. 9A schematically shows a top view of the fabric 10, wherein the fabric 10 comprises the main layer 1, one or more LEDs 2, the electrical connections 4 to electrically connect LEDs 2 to a logic control unit 6, and a covering portion 12 arranged in correspondence of the LEDs 2.

The covering portion 12 allows the light emitted by the LEDs 2 to pass therethrough and thus to be visible from the outside by a user, still concealing the LEDs 2 and the electrical connections 4 when LEDs are turned OFF.

For example, the covering portion 12 may be a fabric layer having a thickness reduced (preferably a thickness less than the thickness of the main layer 1). For example, the covering portion 12 may comprise a white fabric layer, such as a gauze.

As shown in the section view of FIG. 9B, the covering portion 12 may be preferably arranged to form a substantially tubular housing 12a for containing the electrical connections 4 and the LEDs 2.

The covering portion 12 may be for example folded in a substantially U-shaped conformation and coupled to the main layer 1 by closing and fastening the ends of the U-shaped covering portion 12 to the main layer 1 for example by stitching 13, or by other equivalent fastening means known in the art.

It is noted that an article comprising a pocket provided with one or more LEDs, wherein the LEDs are controlled by a logic control unit in response to a sensing signal, coming from a sensing device (e.g. a touch sensor) placed within the pocket, indicative of the presence of an object within the pocket, is inventive per se independently of the way with which LEDs are embedded on the pocket. In other words, a further object of the present invention is an article (preferably a garment) comprising a pocket, at least one LED coupled to the pocket, a sensing unit (preferably a touch sensor) arranged within the pocket and a logic control unit configured to control said at least one LED in function of a sensing signal coming from said sensing device indicative of the presence of an object within the pocket. Some embodiments may provide that the logic control unit is configured to turn on one or more LEDs when the signal coming from the sensing unit changes, for example LEDs can be turned on if an object is inserted into the pocket and/or if an object is removed from the pocket. In general, the logic control unit is configured to control LEDs in function of the sensing signal coming from the sensing device that is indicative of the presence and/or absence of an object within the pocket. Preferably, the pocket comprises a fabric with LED embedded therein according to an embodiment of the process of the present invention or according to process known per se in the art.

The fabric 10 according to the present invention may be used in other article 11 other that garments. For example, article 11 comprising the fabric 10 may be a sofa pillowcase or a fidget device.

Figure 10:
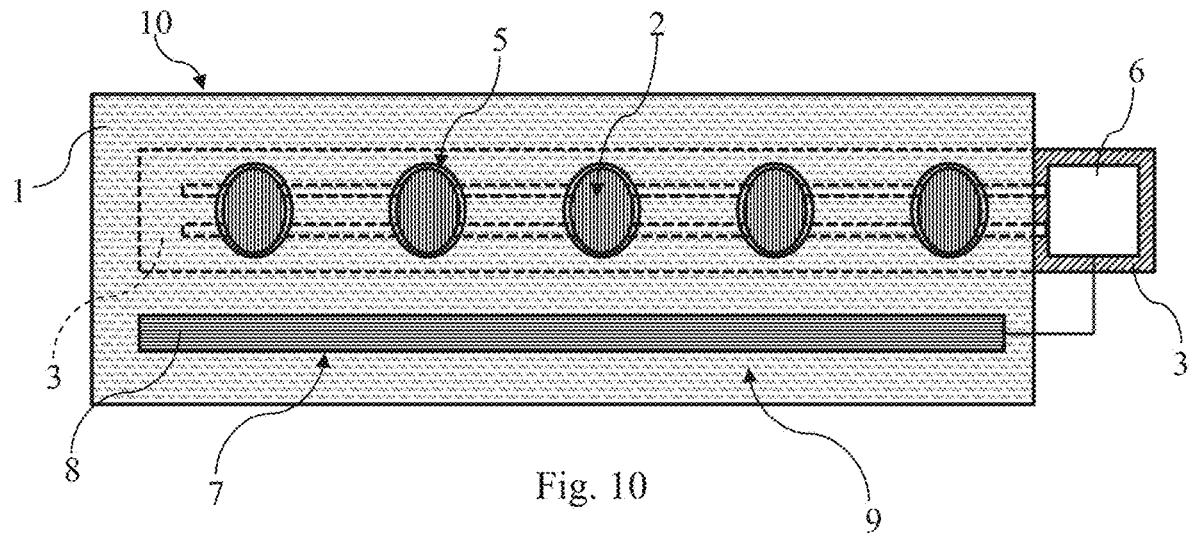
FIGS. 10 and 11 are perspective top views that schematically show two particular embodiments of a fabric according to the present invention.
Figure 11:
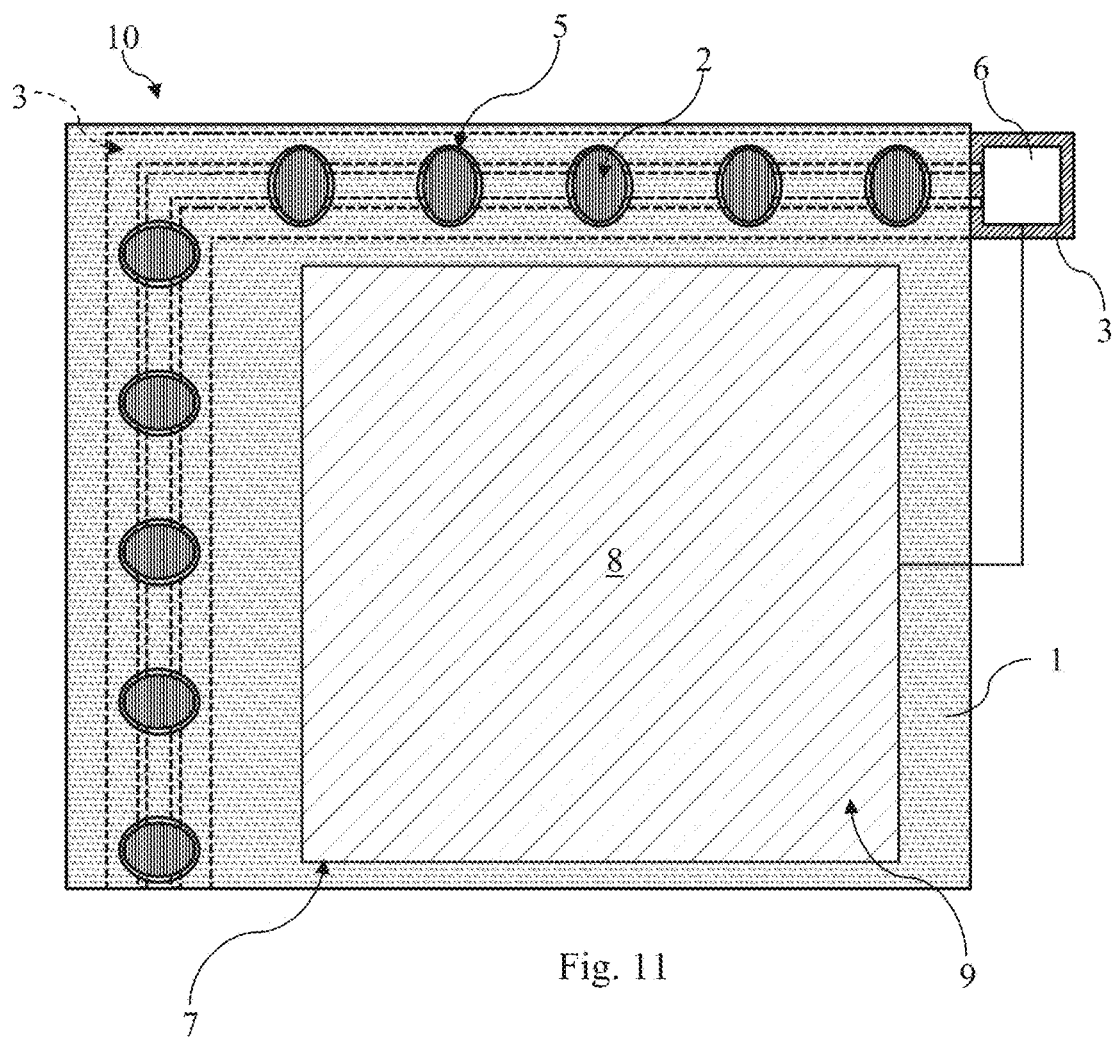

With respect to FIGS. 10 and 11, some embodiments may provide that the fabric 10 comprises a touch sensor 8 configured to detect the position of a touch event along only one direction (as shown in FIG. 10) or on a X-Y plane (as shown in FIG. 10). The touch sensor 8 may be preferably a capacitive touch sensor as described in the European patent application No. EP18172676.1 in the name of the same Applicant and having the following title: "COMPOSITE YARN FOR THE POSITION SENSITIVE CAPACITIVE TOUCH SENSING" (see in particular page 9-15), the contents of which is incorporated herein by reference as if set forth in its entirety. In these embodiments, the logical control unit 6 may be preferably configured to control LEDs 2 in function of the position of a touch event detected on the sensing portion 9 of the fabric 10.

For example, an article 11 may be provided with a fabric 10, as shown in FIG. 10, having a plurality of LEDs 2 arranged along a linear path and a sensing portion 9 arranged along a path that substantially follows the path defined by LEDs. The logic control unit 6 may be configured to turn on selectively one or more LEDs 2 in function of the position of the detected touch event with respect to the length of the path defined by LEDs 2. For example, if the user touches the center of the sensing portion 9 then the logical control unit 6 turns on the LED 2 placed at the center of the path defined by LEDs.

Analogously, an article 11 may be provided with a fabric 10, as shown in FIG. 10, having a plurality of LEDs 2 arranged along two or more sides of a sensing portion 9. The logic control unit 6 may be configured to turn on selectively one or more LEDs 2 in function of the coordinates X-Y of the detected touch event on the sensing portion 9. For example, with respect to the embodiment shown in FIG. 10, if the user touches the center of the sensing portion 9 then the logical control unit 6 turns on the LEDs 2 placed at the center of the two sides.

The invention claimed is:

1. A fabric (10) comprising a main layer (1) and a supporting element (3), at least one LED (2), a control unit (6) and a plurality of electrical connections (4) to electrically connect said at least one LED (2) to said logic control unit (6), the control unit (6) being configured to control said at least one LED (2) based on a sensing signal coming from a sensing device (7), wherein said sensing signal is indicative of a touch event on a layer of the fabric (10) or of a particular event measured by the sensing device (7), wherein said sensing device (7) comprises a touch sensor (8) and an accelerometer, said touch sensor (8) being configured to detect the position of a touch event along at least one direction and said accelerometer being configured to detect an acceleration in a determined direction;

said main layer (1) is provided with at least one opening (5);

a coupling surface (3a) is coupled to an inner surface (1a) of said main layer (1);

said at least one LED (2) protrudes from a coupling surface (3a) of the supporting element (3) and passes at least partially through said at least one opening (5), wherein said sensing device (7)) is coupled to a sensing portion (9) of said main layer (1), and wherein said sensing signal is indicative of a touch event on said sensing portion (9) of said main layer (1) and wherein said logical control unit (6) is configured to control said at least one LED (2) in function of the position of a touch event detected on said sensing portion (9) of the fabric (10) or acceleration in a determined direction when said acceleration exceeds a certain threshold value.

2. The fabric (10) according to claim 1, wherein said at least one LED (2) is arranged on a coupling surface (3a) of said supporting element (3), said supporting element (3) comprising said plurality of electrical connections (4).

3. The fabric (10) according to claim 1, wherein said supporting element (3) is coupled to said main layer (1) by lamination.

4. The fabric (10) according to claim 1, wherein the size of said at least one opening (5) is substantially the same of the size of said at least one LED (2).

5. The fabric (10) according to claim 1, wherein said at least one opening (5) is made by laser cutting.

6. The fabric (10) according to claim 1, wherein said fabric (10) comprises a plurality of said LEDs (2) and a plurality of said openings (5), for each LED (2) an opening (5) being arranged in correspondence therewith.

7. The fabric (10) according to claim 1, wherein said sensing device (7) comprises a touch sensor (8).

8. The fabric according to claim 7, wherein said touch sensor (8) is a capacitive touch sensor.

9. The fabric (10) according to claim 2, wherein said supporting element (3) is shaped as a ribbon.

10. The fabric (10) according to claim 2, wherein said supporting element (3) is made of plastic and/or textile.

11. The fabric (10) according to claim 2, wherein said supporting element (3) is elastically stretchable by at least 10%.

12. An article (11) comprising a fabric (10) according to claim 1.

13. The article (11) according to claim 12, wherein said article (11) is a garment or a fidget device.

14. The article (11) according to claim 12, wherein said article (11) includes a pocket (11a) comprising said fabric (10), said sensing unit (7) being arranged within said pocket (11a).

15. The article (11) according to claim 14, wherein said logic control unit (6) is configured to control said at least one LED (2) in function of a sensing signal coming from said sensing device (7) indicative of the presence and/or absence of an object within the pocket (11a).

* * * * *